United States Patent
Kawai et al.

(10) Patent No.: US 7,920,082 B2
(45) Date of Patent: Apr. 5, 2011

(54) D/A CONVERTER CIRCUIT AND DIGITAL INPUT CLASS-D AMPLIFIER

(75) Inventors: Hirotaka Kawai, Hamamatsu (JP); Nobuaki Tsuji, Hamamatsu (JP); Morito Morishima, Fukuroi (JP); Yohei Otani, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 36 days.

(21) Appl. No.: 12/583,792

(22) Filed: Aug. 26, 2009

(65) Prior Publication Data

US 2010/0117730 A1    May 13, 2010

(30) Foreign Application Priority Data

Aug. 28, 2008    (JP) .................................. 2008-220127

(51) Int. Cl.
*H03M 1/20*    (2006.01)

(52) U.S. Cl. ..... 341/131; 341/143; 341/144; 330/207 A; 330/251

(58) Field of Classification Search .................. 341/131, 341/144
See application file for complete search history.

(56) References Cited

U.S. PATENT DOCUMENTS

| | | | | |
|---|---|---|---|---|
| 4,644,324 A * | 2/1987 | Araki et al. | ................... | 341/131 |
| 5,012,242 A * | 4/1991 | Yoshio et al. | ................. | 341/131 |
| 5,073,778 A * | 12/1991 | Ueki et al. | ................... | 341/131 |
| 5,818,372 A * | 10/1998 | Noro | ............................. | 341/131 |
| 7,471,223 B2 * | 12/2008 | Lee | ............................... | 341/131 |

* cited by examiner

*Primary Examiner* — Khai M Nguyen
(74) *Attorney, Agent, or Firm* — Pillsbury Winthrop Shaw Pittman LLP

(57) ABSTRACT

The present invention provides a D/A converter circuit which enables D/A conversion with a high precision and can prevent occurrence of a limit cycle component in the case where an input signal is low, and can also prevent the effect of dither signal from occurring in an analog signal which is a D/A conversion result.

A dither signal generation section 505 outputs a dither signal (DITHER) which is an alternating current signal and a reversal dither signal (DITHER_N) inverted from the dither signal. A DEM decoder 502 processes an input digital signal including a component of the dither signal (DITHER), and outputs a plurality of lines of time-series digital signals having a density of "1" or "0" conforming to the input digital signal to be processed. An analog addition section 503 converts a plurality of lines of time-series digital signals and the reversal dither signal (DITHER_N) into an analog signal respectively and adds them, and outputs an analog signal which is a D/A conversion result.

12 Claims, 10 Drawing Sheets

[FIG. 1]
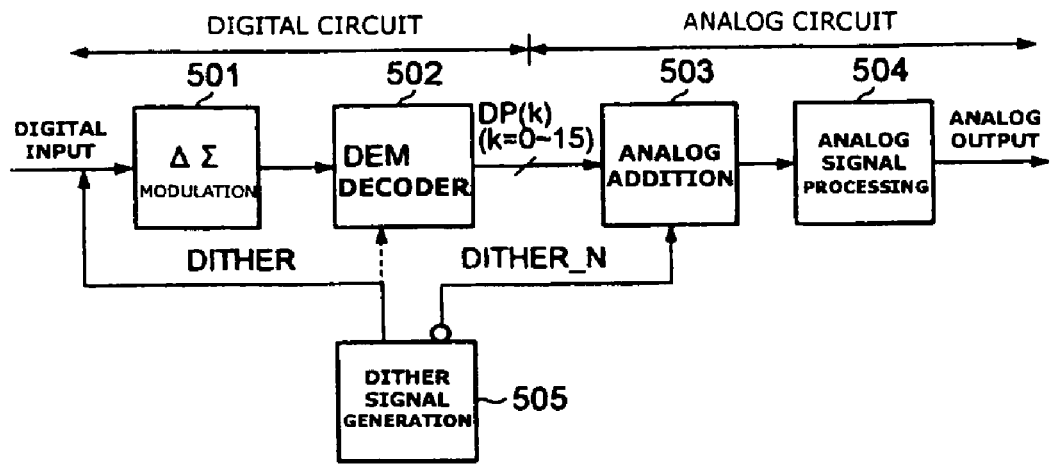
[FIG. 2]
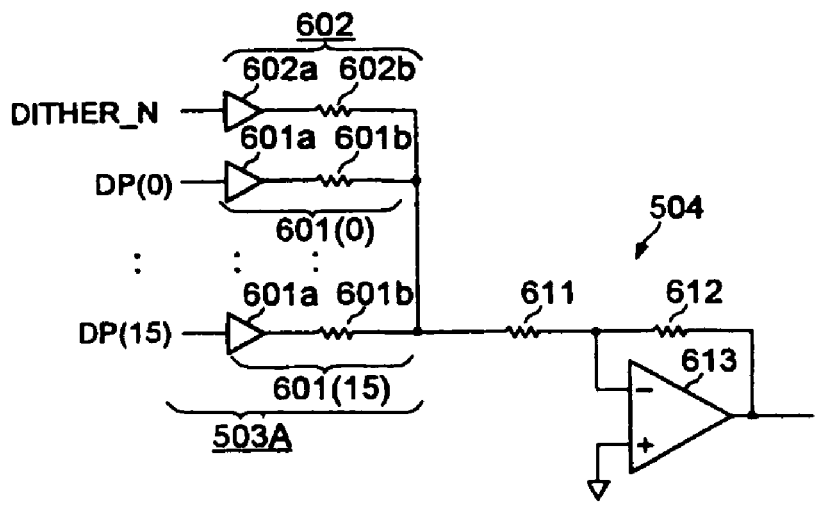
[FIG. 3]
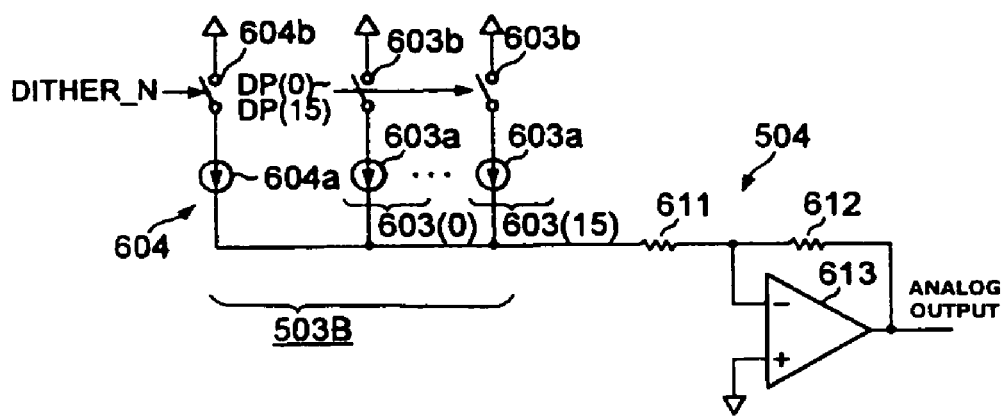

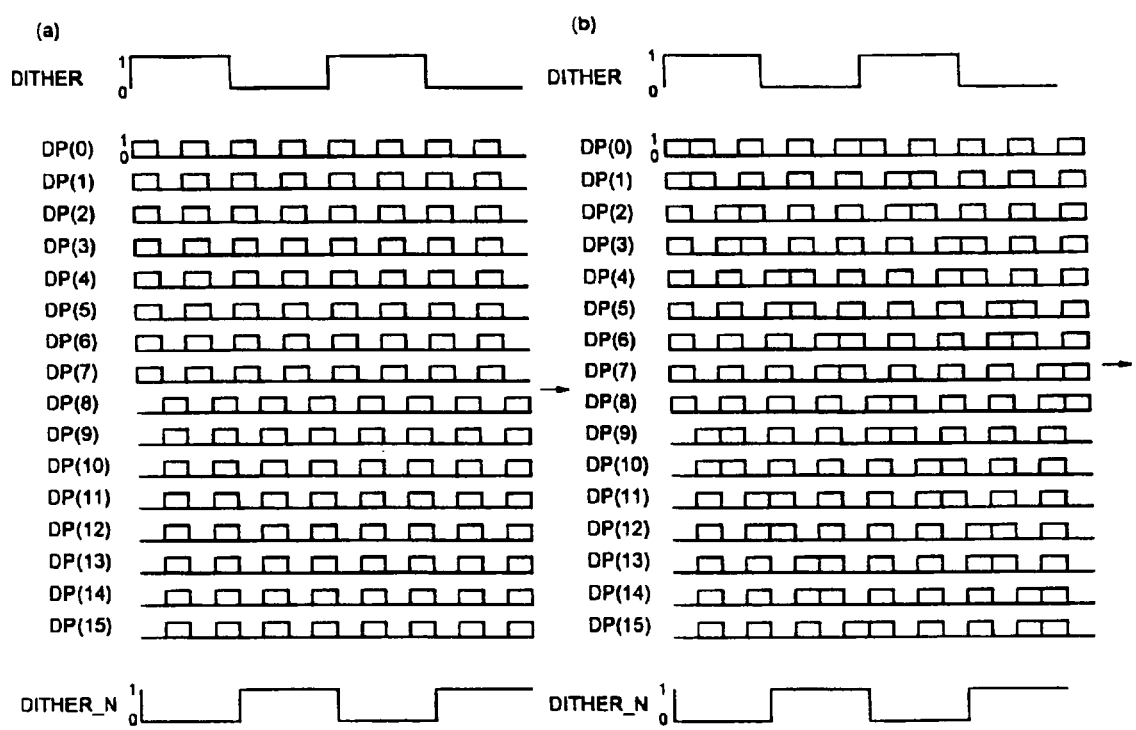
[FIG. 4]

[FIG. 5]
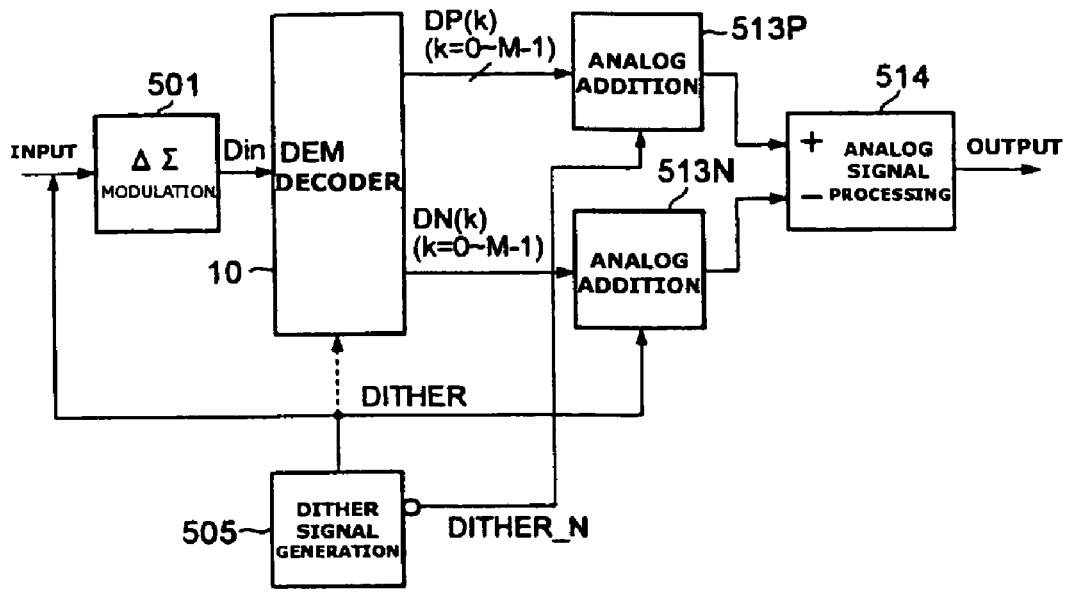
[FIG. 6]
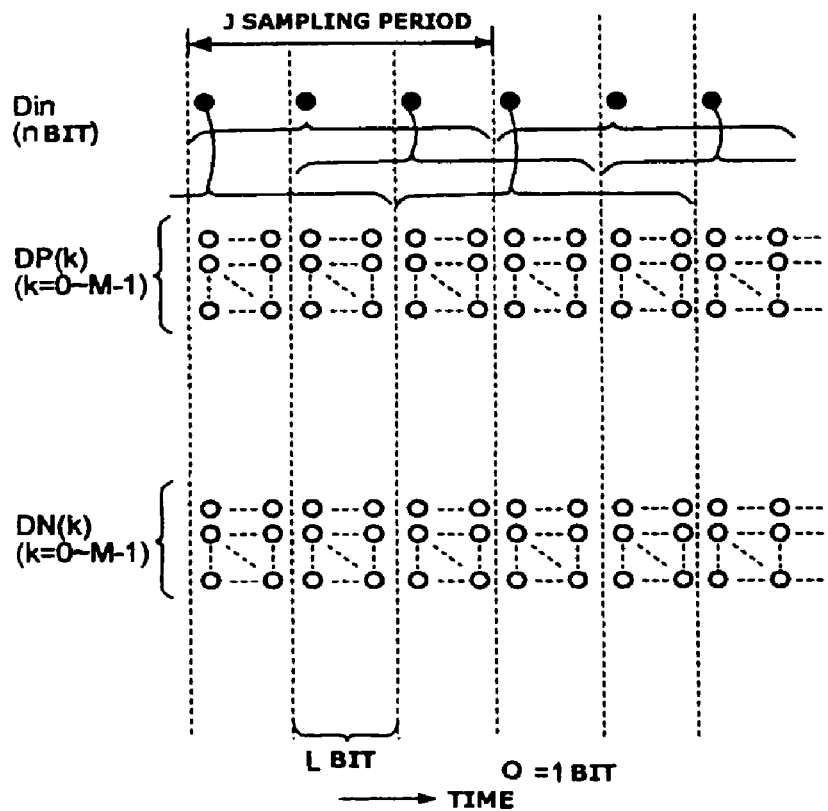

[ FIG. 7 ]
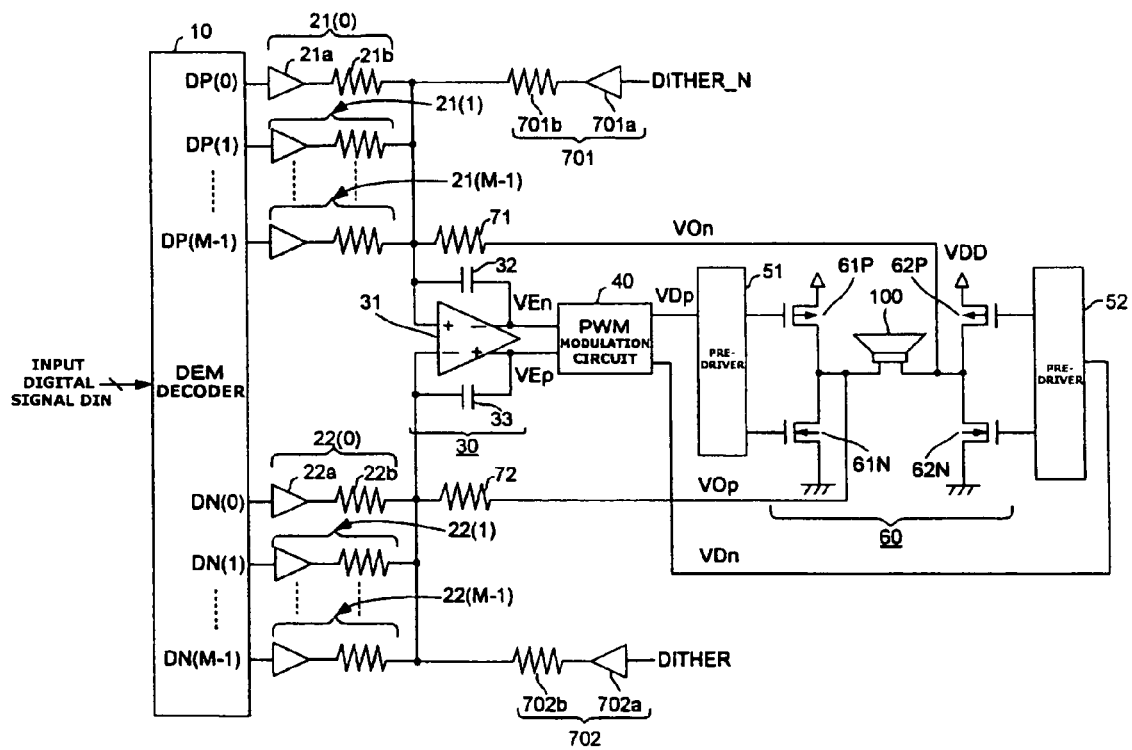

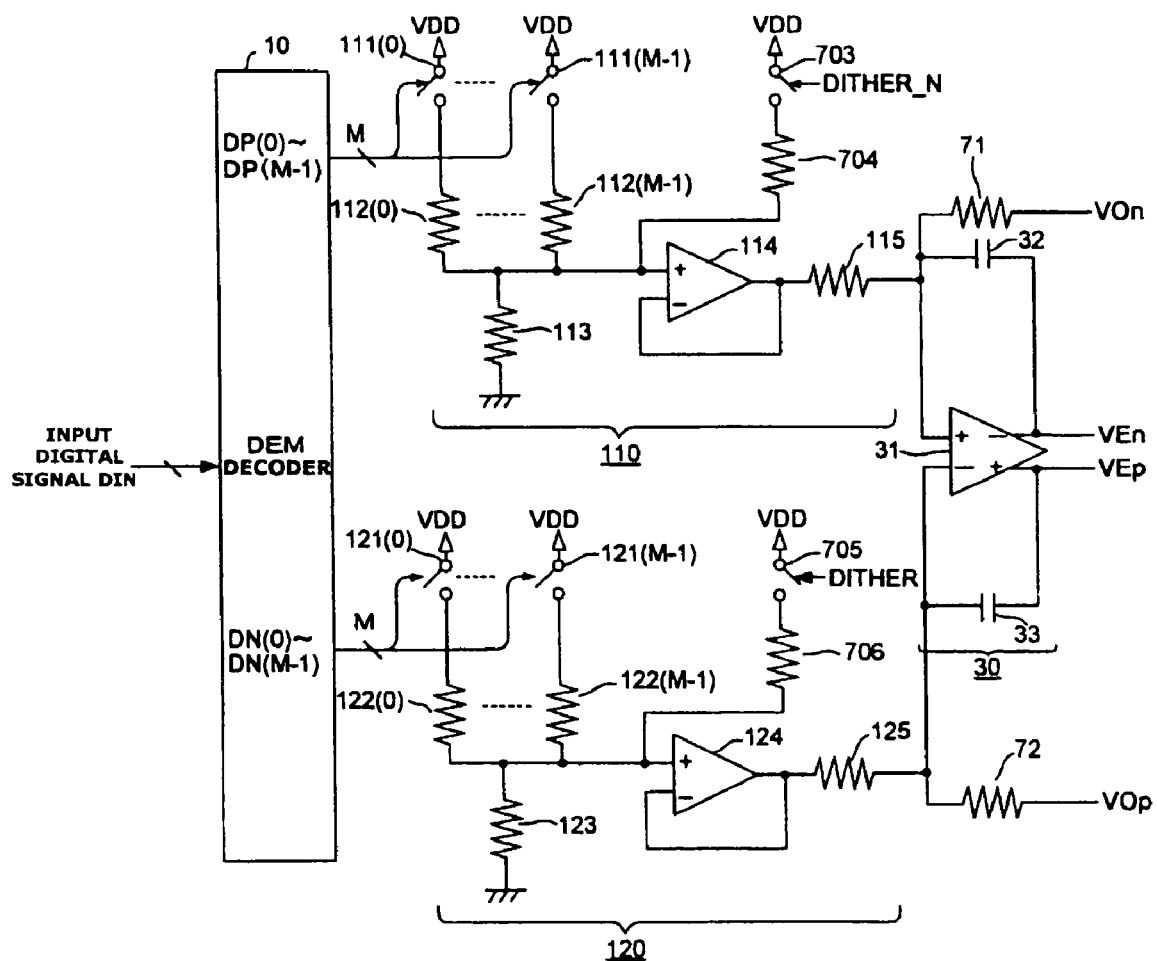
[FIG. 8]

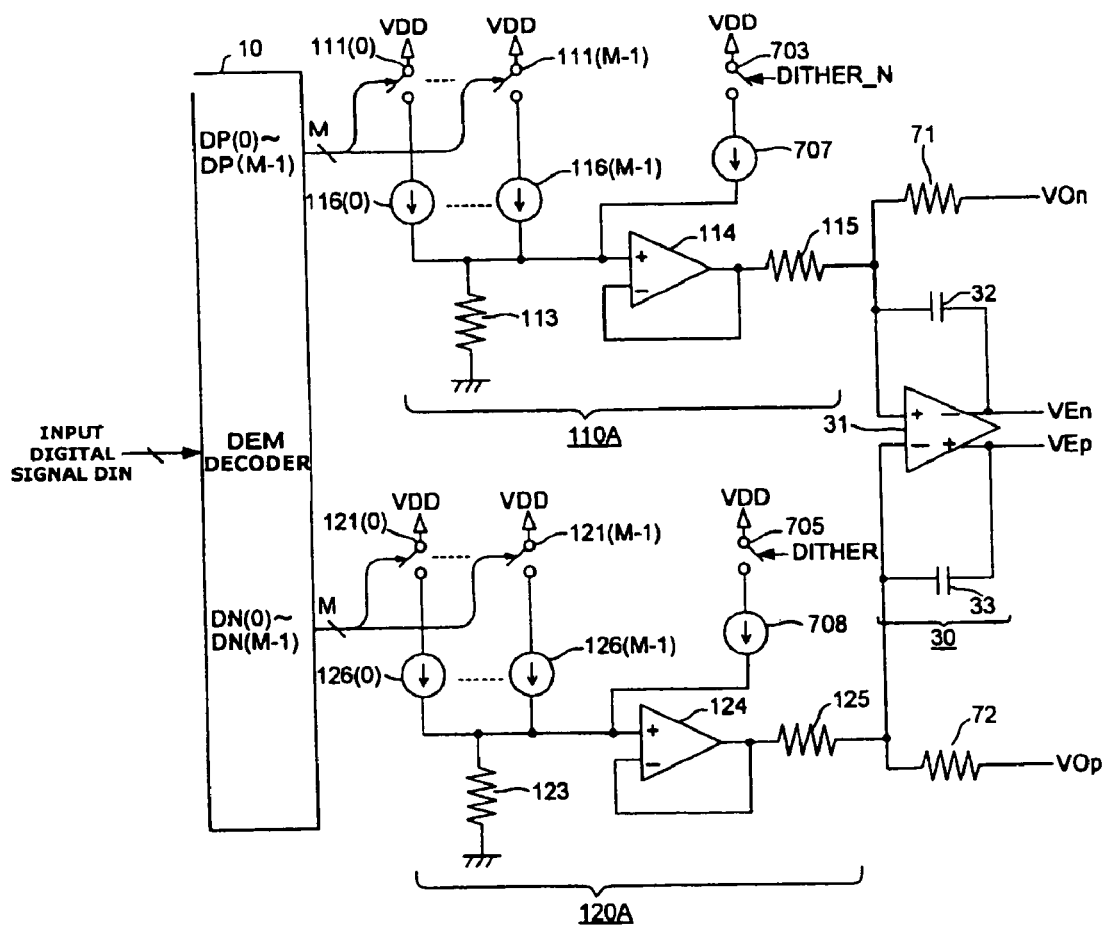
[FIG.9]

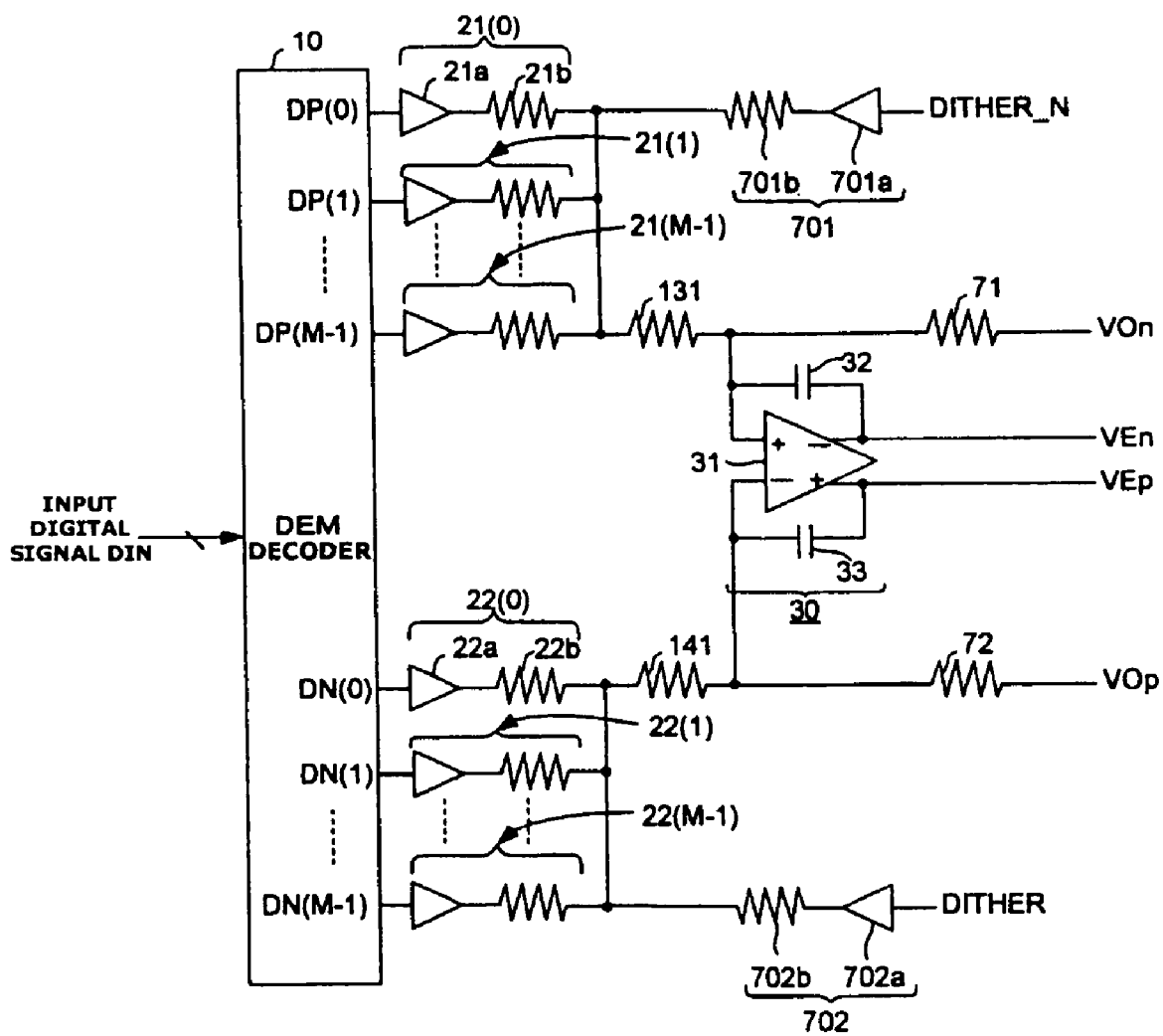
{ FIG.10 }

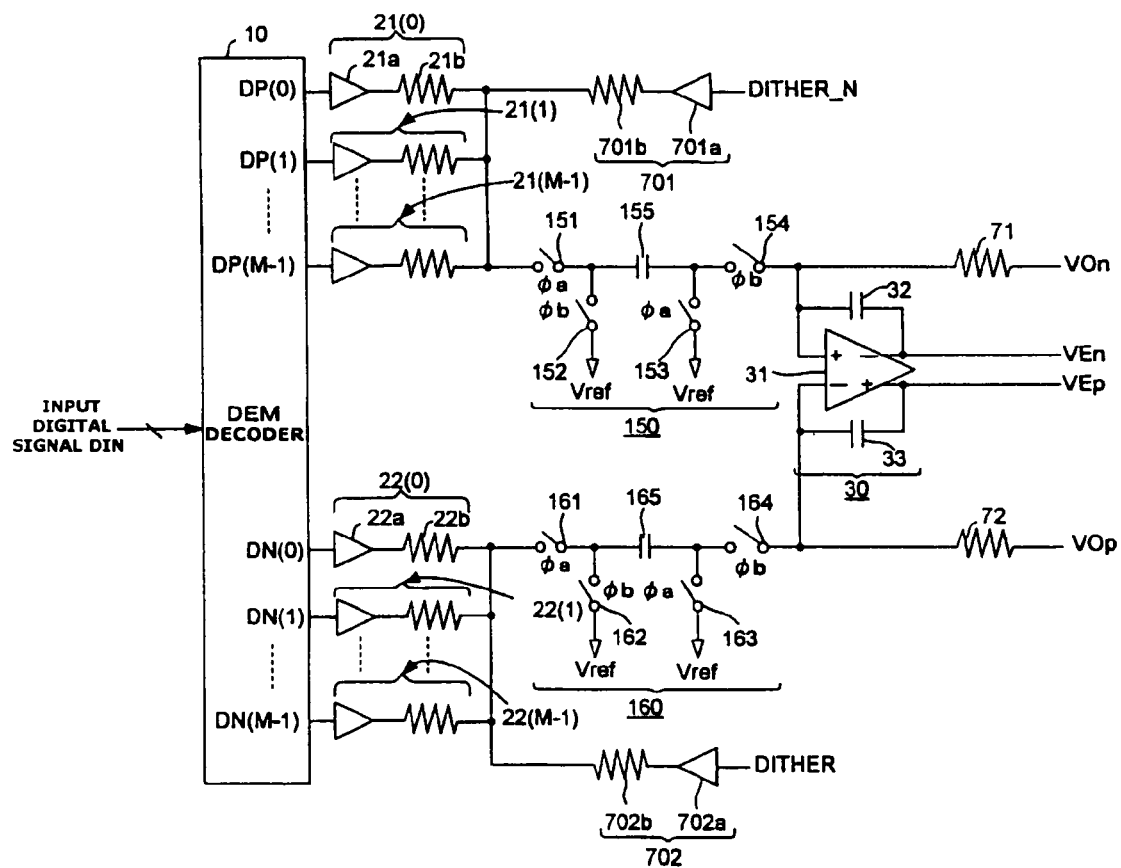
[FIG. 11]

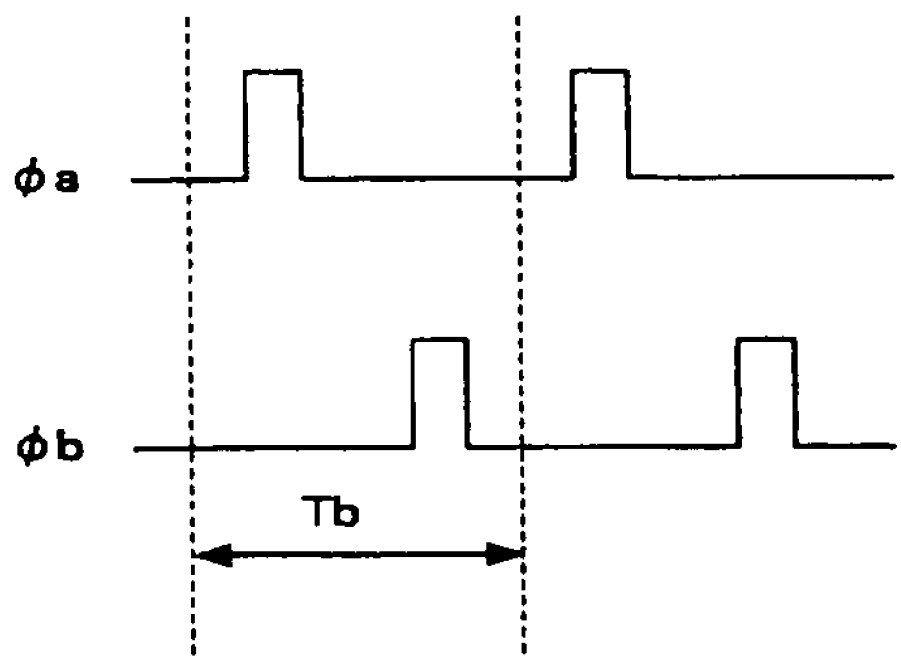
[FIG. 12]

[FIG. 13]
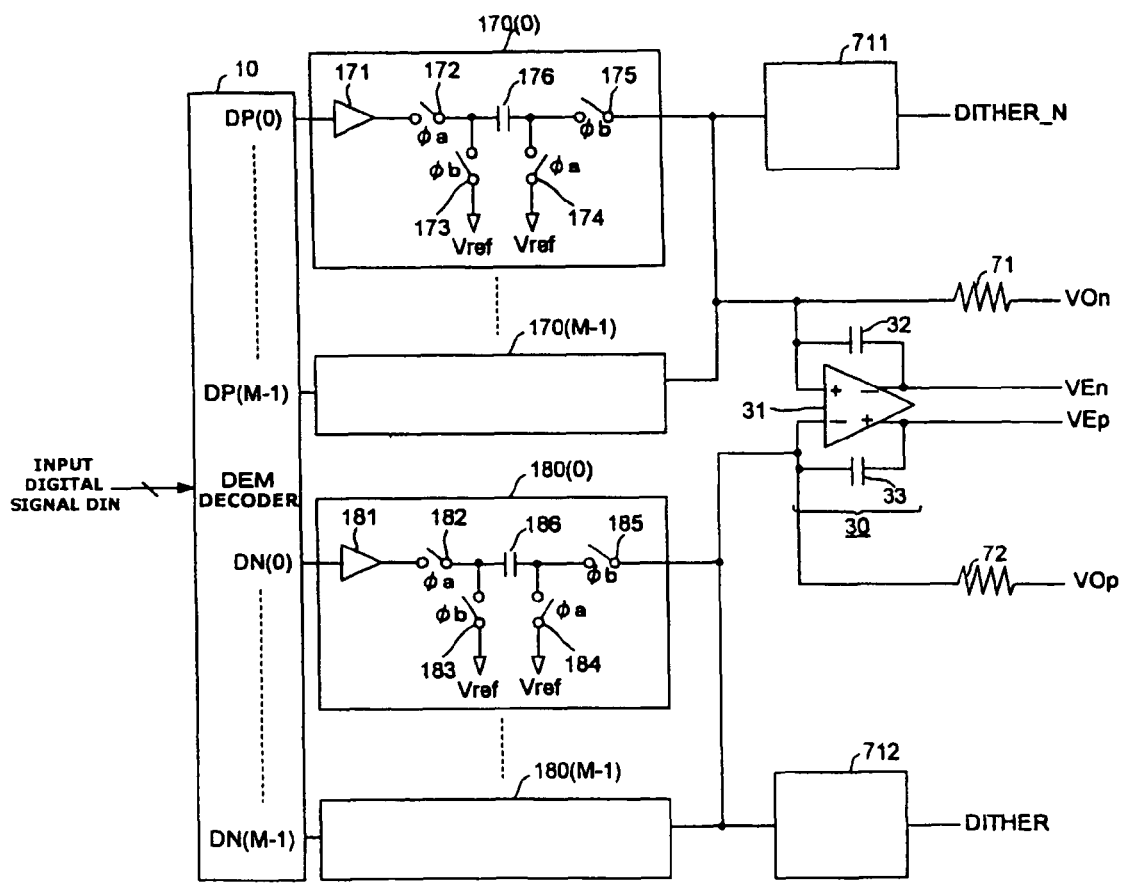

D/A CONVERTER CIRCUIT AND DIGITAL INPUT CLASS-D AMPLIFIER

BACKGROUND OF THE INVENTION

The present invention relates to a Digital-to-Analog converter circuit (hereinafter, simply referred to as D/A converter circuit) and a digital input class-D amplifier suitable for audio equipment, and the like.

As a technique for enhancing the accuracy of D/A conversion, there is a DEM (Dynamic Element Matching) technique. In a D/A converter circuit using the DEM technique, a plurality of lines of time-series digital signals having a density of "1" or "0" is generated by a decoder called a DEM decoder conforming to an input digital signal, and an analog signal which is a D/A conversion result is created by converting the plurality of lines of time-series digital signals into an analog signal respectively and adding them. Although the high linearity is obtained by the D/A converter circuit using the DEM decoder, the problem is that a limit cycle component appears in the analog signal which is the D/A conversion result, when the input digital signal has a somewhat different level from 0. For example, if the level of input digital signal goes slightly higher than 0 in plus direction, the "1" breaking the balanced state between the density of "1" and "0" appears in a plurality of lines of time-series digital signals outputted from the DEM decoder in low-frequency periodically, and it becomes a noise of low-frequency and appears in the analog signal which is the D/A conversion result. When the analog signal outputted from D/A converter circuit is used to drive a speaker, such a limit cycle component is not desirable because it becomes unpleasant noise to ears and is sound-proofed from the speaker. Therefore, conventionally the measure which generates dither signals and adds them to the digital signal which is to be processed by the DEM decoder was being done. This measure can be divided into the method which adds DC dither as a dither signal to the digital signal which is to be processed by the DEM decoder (hereinafter, referred to as direct current dither method) and the method which adds alternating current signal of which the DC component is 0 (hereinafter, referred to as alternating current dither method). Also, such a type of the technique using a dither signal for a prevention of limit cycle is, for instance, disclosed on Patent Document 1, 2.

Patent Document 1: Japanese Patent Application Publication No. 2006-42272

Patent Document 2: Japanese Patent Application Publication No. 2006-304084

However, the above-mentioned direct current dither method has a disadvantage from the point that it needs a mean for preventing a DC offset from being supplied to the speaker which is a load, since the DC offset corresponding to the DC dither to be added to the digital signal which is to be processed by the DEM decoder appears in the analog signal which is the D/A conversion result. The alternating current dither method does not have such a disadvantage, because it uses the alternating current signal of which the DC component is 0 as the dither signal. However, in the case of using the alternating current dither method, the component of dither signal which is alternating current signal appears in the analog signal which is the D/A conversion result. Because the frequency of the component of the dither signal is low, there was a problem that it appears as a drive waveform of a load by passing an amplifier and the like, in the rear end of the D/A converter circuit.

SUMMARY OF THE INVENTION

The present invention has been conceived in view of the above-described circumstance, and aims at providing a D/A converter circuit which enables D/A conversion with a high precision and can prevent occurrence of a limit cycle component in the case where an input signal is low, and can also prevent the effect of the dither signal from occurring in the analog signal which is the D/A conversion result.

The present invention provides a D/A converter circuit including a dither signal generator which outputs a dither signal which is an alternating current signal and a reversal dither signal inverted from the dither signal, a decoder which processes an input digital signal including a component of the dither signal and outputs a plurality of lines of time-series digital signals having a density of "1" or "0" conforming to the input digital signal, and an analog adder which converts the plurality of lines of time-series digital signals and the reversal dither signal into an analog signal respectively and adds the respective analog signals to be a combined signal, and outputs the combined signal as an analog signal which is a Digital-to-Analog conversion result.

According to the present invention, the respective analog signals corresponding to the plurality of lines of time-series digital signals and the analog signal corresponding to the reversal dither signal are added at the analog adder. In this case, a component corresponding to the component of the dither signal is included in the analog signal to which the respective analog signals corresponding to the plurality of lines of time-series digital signals are added, however, this component and the analog signal corresponding to the reversal dither signal are cancelled each other in accordance with the addition performed by the analog adder. Therefore, it is possible to prevent the component of the dither signal from appearing in the analog signal which is a D/A conversion result.

Also, Patent Document 1 discloses a technique that, in the digital input class-D amplifier which operates based on a digital signal to which the DC dither is added, generates voltage on a switching circuit section, which cancels a DC dither by means of timing control of a dead-time control section in the front end of the switching circuit section which is the last end. However, the Patent Document 1 does not disclose a technique that supplies the reversal dither signal inverted from the dither signal which is an alternating current signal to the analog adder in the same manner as the present invention. Also, Patent Document 2 discloses a D/A converter circuit which has a DEM circuit and a dither circuit in FIG. 14. However, the Patent Document 2 does not disclose a technique that supplies the reversal dither signal inverted from the dither signal which is an alternating current signal to the analog adder in the same manner as the present invention.

BRIEF DESCRIPTION OF THE DRAWINGS

The embodiments of the present invention will become more apparent by describing in detail with reference to the attached drawings:

FIG. 1 is a block diagram showing the configuration of an audio circuit which includes a D/A converter circuit according to the first embodiment of the present invention;

FIG. 2 is a circuit diagram showing the configuration of an analog addition section 530 according to the first embodiment;

FIG. 3 is a circuit diagram showing another configuration of an analog addition section 530 according to the first embodiment;

FIG. 4 is a waveform diagram showing output signal waveforms of a DEM decoder 502 and output signal waveforms of a dither signal generation section 505 according to the first embodiment;

FIG. 5 is a block diagram showing the configuration of an audio circuit which includes a D/A converter circuit according to the second embodiment of the present invention;

FIG. 6 is a diagram showing the operation of a DEM decoder 10 according to the second embodiment;

FIG. 7 is a circuit diagram showing the configuration of a digital input class-D amplifier according to the third embodiment of the present invention.

FIG. 8 is a circuit diagram showing the configuration of a digital input class-D amplifier according to the fourth embodiment of the present invention;

FIG. 9 is a circuit diagram showing the configuration of a digital input class-D amplifier according to the fifth embodiment of the present invention;

FIG. 10 is a circuit diagram showing the configuration of a digital input class-D amplifier according to the sixth embodiment of the present invention;

FIG. 11 is a circuit diagram showing the configuration of a digital input class-D amplifier according to the seventh embodiment of the present invention;

FIG. 12 is a diagram showing the waveform of clock (Φa and Φb) used in the seventh embodiment;

FIG. 13 is a circuit diagram showing the configuration of a digital input class-D amplifier according to the eighth embodiment of the present invention.

DETAILED DESCRIPTION OF EXEMPLARY EMBODIMENTS

An embodiment of the present invention will be described hereunder by reference to the drawings.

The First Embodiment

FIG. 1 is a block diagram showing the configuration of an audio circuit including D/A converter circuit which is the first embodiment of the present invention. The audio circuit has a ΔΣ modulation section 501, a DEM decoder 502, an analog addition section 503, an analog signal processing section 504 and a dither signal generation section 505. In this case, the DEM decoder 502, the analog addition section 503, and the dither signal generation section 505 are the main components of the D/A converter circuit according to the present embodiment.

The ΔΣ modulation section 501 outputs a digital signal where the quantization noise of the input digital audio signal moves to high area side, by performing ΔΣ modulation to an input digital audio signal such as PCM signal and the like. The DEM decoder 502 is a circuit outputting a plurality of lines (in the example, 16 lines) of time-series digital signals DP(k) (k=0 to 15) which has a density of "1" or "0" conforming to a digital signal supplied from the ΔΣ modulation section 501. The analog addition section 503 converts time-series digital signals DP(k) (k=0 to 15) outputted from the DEM decoder 502 and a reversal dither signal (DITHER_N) described later into an analog signal respectively and adds them, and outputs the added signals as an analog signal which is the D/A conversion result. The analog signal processing section 504 is a circuit processing the analog signal outputted from the analog addition section 503, and, for example, is an amplifier driving a speaker based on the analog signal.

The dither signal generation section 505 outputs a dither signal which is an alternating current signal, specifically the dither signal (DITHER) of square wave, and a reversal dither signal (DITHER_N) inverted from the dither signal (DITHER), and adds the dither signal (DITHER) into the digital signal which is to be processed by the DEM decoder 502, and also supplies the reversal dither signal (DITHER_N) to the analog addition sections 503. It is desirable that the frequency of the dither signal (DITHER) and the reversal dither signal (DITHER_N) is higher than an audible area, and for instance, it is 100 kHz. In the present example, the dither signal (DITHER) and the reversal dither signal (DITHER_N) are all square wave of which the duty ratio is 50%, and do not include a direct current component. However, the dither signal (DITHER) and the reversal dither signal (DITHER_N) may be the alternating current signal including a direct current component. The reason is that, for example, although the duty ratio of the dither signal (DITHER) and the reversal dither signal (DITHER_N) is not 50% and each includes a direct current component, an alternating current component of the addition result becomes 0 and a direct current component also becomes 0 in the case of adding the dither signal (DITHER) and the reversal dither signal (DITHER_N). As for the configuration for adding the dither signal (DITHER) into the digital signal which is to be processed by the DEM decoder 502, various embodiments are considered. In some embodiments, the dither signal (DITHER) where an input digital audio signal has been added, is inputted into the ΔΣ modulation section 501. In another embodiments, dither signal (DITHER) is supplied to the DEM decoder 502, and the DEM decoder 502 converts an output signal of the ΔΣ modulation section 501 to which the dither signal (DITHER) has been added into time-series digital signals DP(k) (k=0 to 15). In any embodiments, the signal to be processed by the DEM decoder 502 is a digital signal including the component of the dither signal (DITHER).

As for the configuration of the analog addition section 503, various embodiments can be applied. FIG. 2 and FIG. 3 show the examples respectively. In FIG. 2, an analog addition section 503A which is an example of the analog addition section 503 has voltage-current conversion sections 601(k) (k=0 to 15) and a voltage-current conversion section 602. And, each of voltage-current conversion sections 601(k) (k=0 to 15) has a non-inverting buffer 601a and a resistor 601b of which the one end is connected to the output terminal of the non-inverting buffer 601a. Also, the voltage-current conversion section 602 has a non-inverting buffer 602a and a resistor 602b of which the one end is connected to the output terminal of the non-inverting buffer 602a. The other end of each resistor 601b of voltage-current conversion sections 601(k) (k=0 to 15) and the other end of the resistor 602b of voltage-current conversion section 602 are connected commonly, and the common node is connected to the input terminal of the analog signal processing section 504. In this example, the analog signal processing section 504 is a nonequilibrium-type amplifier which is comprised of resistors 611 and 612 and an operation amplifier 613.

In such a configuration, the time-series digital signals DP(k) (k=0 to 15) outputted from the DEM decoder 502 are supplied to the respective non-inverting buffers 602a of voltage-current conversion sections 601(k) (k=0 to 15). Also, the reversal dither signal (DITHER_N) outputted from the dither signal generation section 505 is supplied to the non-inverting buffer 602a of the voltage-current conversion section 602. The respective voltage-current conversion sections 601(k) (k=0 to 15) supply current which is inversely proportional to the resistance value to a resistor 611 through the resistor 601b only in the period during which the signal value of time-series digital signal DP(k) supplied to the respective is "1". Also, the voltage-current conversion section 602 supplies current which is inversely proportional to the resistance value to the resistor 611 through the resistor 602b only in the period during which the signal value of reversal dither signal (DITH- ER_N) is "1". And, the current obtained by adding current flowing the respective resistors 601b of the voltage-current conversion sections 601(k) (k=0 to 15) and current flowing the resistor 602b of the voltage-current conversion section 602, is supplied to the analog signal processing section 504.

Under an ideal circumstance, the respective resistors 601b of the voltage-current conversion sections 601(k) (k=0 to 15) have the identical resistance value R1. The resistance value R2 of the resistor 602b of the voltage-current conversion section 602 is decided based on the amplitude of the dither signal (DITHER). Namely, the maximum value of a total sum of the current outputted from voltage-current conversion sections 601(k) (k=0 to 15) becomes the value that is proportional to R1/16, and for instance, in the case the amplitude of the dither signal (DITHER) is −20 dB (=$\frac{1}{10}$), the resistance value R2 of the resistor 602 becomes the value which is 10 times as much as the resistance value R1/16, that is R1/16*10.

In FIG. 3, an analog addition section 503B which is an example of the analog addition section 503 has voltage-current conversion sections 603(k) (k=0 to 15) and a voltage-current conversion section 604. And, each of the voltage-current conversion sections 603(k) (k=0 to 15) has a constant current source 603a and a switch 603b inserted between the one end of the constant current source 603a and a reference voltage source. The voltage-current conversion section 604 has a constant current source 604a and a switch 604b inserted between the one end of the constant current source 604a and the reference voltage source. The other end of each constant current source 603a of the voltage-current conversion sections 603(k) (k=0 to 15) and the other end of constant current source 604a of the voltage-current conversion section 604 are connected commonly, and the common node is connected to the input terminal of the analog signal processing section 504 as shown in FIG. 2.

In such a configuration, the time-series digital signals DP(k) (k=0 to 15) outputted from the DEM decoder 502 are supplied to the respective switches 603b of the voltage-current conversion sections 603(k) (k=0 to 15). Also, the reversal dither signal (DITHER_N) outputted from the dither signal generation section 505 is supplied to the switch 604b of the voltage current conversion section 604. In the respective voltage current conversion sections 603(k) (k=0 to 15), the switches 603b are turned ON only in the period during which the signal value of time-series digital signals DP(k) supplied to the respective is "1", and the current is outputted from the constant current source 603a to the analog signal processing section 504. Also, in the voltage-current conversion section 604, the switch 604b is turned ON only in the period during which the signal value of the reversal dither signal (DITHER_N) is "1", the current is outputted from the constant current source 604a to the analog signal processing section 504. By this process, a total sum of current outputted from the voltage-current conversion sections 603(k) (k=0 to 15) and the voltage-current conversion section 604 is inputted to the analog signal processing section 504.

Under an ideal circumstance, output current values I1 of the respective constant current sources 603a of the voltage-current conversion sections 603(k) (k=0 to 15) are the same. An output current value I2 of the constant current source 604a of the voltage-current conversion section 604 is decided on the basis of the amplitude of the dither signal (DITHER). Namely, the maximum value of a total sum of the current outputted from the voltage-current conversion sections 603(k) (k=0 to 15) becomes I1*16, and for example, in the case the amplitude of the dither signal (DITHER) is −20 dB (=$\frac{1}{10}$), the current value I2 of the constant current source 604a becomes the value which is $\frac{1}{10}$ times as much as the current value I1*16, that is I1*16/10.

FIG. 4(a) and (b) are waveform diagrams showing the waveform of the time-series digital signals DP(k) (k=0 to 15) outputted from the DEM decoder 502, the dither signal (DITHER) and the reversal dither signal (DITHER_N) outputted from the dither signal generation section 505. In order to prevent diagrams from being complicated in FIG. 4(a) and (b), an illustration of the components corresponding to dither signal (DITHER) included in the time-series digital signals DP(k) (k=0 to 15) is omitted. The operation of the present embodiment will be described below by referring to FIG. 4(a) and (b).

In the case a level of an input signal (i.e., a digital signal) to the DEM decoder 502 is 0, if disregarding the signal which corresponds to the dither signal (DITHER), "1" and "0" are generated equally with the same density in time-series digital signals DP(k) (k=0 to 15) as shown in FIG. 4(a). When the level of an input signal to the DEM decoder 502 goes up to plus direction, as shown in FIG. 4(b), the density of "1" increases and the density of "0" decreases in the time-series digital signals DP(k) (k=0 to 15). And, when the level of an input signal to the DEM decoder 502 is slightly higher than 0, the above-described limit cycle component appears in the time-series digital signals DP(k) (k=0 to 15), if the dither signal (DITHER) is not inputted. Namely, the "1" breaking the balanced state between the density of "1" and the density of "0" in the time-series digital signals DP(k) (k=0 to 15) appears in low frequency periodically. However, because the present embodiment includes the dither signal (DITHER) of which the input signal to the DEM decoder 502 is around 100 kHz, the limit cycle component in the time-series digital signals DP(k) (k=0 to 15) is masked.

In this case, if time-series digital signals DP(k) (k=0 to 15) are only supplied to analog addition section 503 and the reversal dither signal (DITHER_N) is not supplied thereto, the component of the dither signal (DITHER) appears in the analog signal waveform obtained by adding the analog signal which corresponds to the time-series digital signals DP(k) (k=0 to 15) in the analog addition section 503. Because the frequency of the component of the dither signal (DITHER) in the analog signal waveform is low to the extent that the analog signal processing section 504 can respond, it passes through the analog signal processing section 504 and appears in the drive waveform of a load (not shown) of the analog signal processing section 504, which is not desirable.

However, in the present embodiment, the reversal dither signal (DITHER_N) inverted from the dither signal (DITHER) along with the time-series digital signals DP(k) (k=0 to 15) is supplied to the analog addition section 503. In the addition processing performed by the analog addition section 503, the component of the dither signal (DITHER) in the analog signal corresponding to the time-series digital signals DP(k) (k=0 to 15) and the analog signal corresponding to the reversal dither signal (DITHER_N) are cancelled each other. Consequently, the transmitting of the component of the dither signal (DITHER) to the analog signal processing section 504 is prevented, and the component of dither signal (DITHER) (a direct current component and an alternating current component) can be prevented from appearing in the drive waveform of the load (not shown) of the analog signal processing section 504.

As described above, according to the present embodiment, occurrence of the limit cycle in the situation when a level of input signal to the DEM decoder 502 is low by means of the generation of the dither signal (DITHER) can be prevented, and the component of the dither signal (DITHER) can be prevented from transmitting to the analog signal processing section 504.

The Second Embodiment

FIG. 5 is the block diagram showing the configuration example of an audio circuit including D/A converter circuit that is the second embodiment of the present invention. The audio circuit has a ΔΣ modulation section 501 similar to that of the first embodiment, a DEM decoder 10, analog addition sections 513P and 513N, an analog signal processing section 514 of differential input type and a dither signal generation section 505 similar to that of the first embodiment. In this case, the DEM decoder 10, the analog addition sections 513P and 513N, and the dither signal generation section 505 are the main components of the D/A converter circuit according to the present embodiment.

In FIG. 5, the DEM decoder 10 processes an input digital signal including the component of the dither signal, and outputs positive phase time-series digital signals DP(k) (k=0 to M−1) and negative-phase time-series digital signals DN(k) (k=0 to M−1) in equilibrium with the time-series digital signals DP(k) (k=0 to M−1), each positive phase and negative phase time-series digital signal having a density of "1" or "0" conforming to the input digital signal to be processed.

Although various algorithms are considered as a DEM algorithm suitable for the present embodiment, anything is acceptable so long as it generates the time-series digital signals DP(k) (k=0 to M−1) and DN(k) (k=0 to M−1) from the input digital signal Din to the DEM decoder 10 so as to satisfy at least the following conditions:

a. As shown in FIG. 6, the density of "1" in all bits (M×L×J bits) of the time-series digital signals DP(k) (k=0 to M−1) generating in preceding and subsequent J sampling periods including a sampling period when a sample of the input digital signal Din is supplied and the density of "0" in all bits (M×L×J bits) of the time-series digital signals DN(k) (k=0 to M−1) in the same periods become the density that is proportional to a sample value of the input digital signal Din respectively.

b. In an arbitrary sampling period, the appearance of density of "1" or "0" per bit of time-series digital signals DP(k) (k=0 to M−1) becomes uniform among bits, and the appearance of density of "1" or "0" per bit of time-series digital signals DN(k) (k=0 to M−1) also becomes uniform among bits.

The analog addition section 513P converts the time-series digital signals DP(k) (k=0 to M−1) of positive-phase and the reversal dither signal (DITHER_N) into an analog signal respectively and adds them, and outputs the analog signal of positive-phase which is the D/A conversion result to a positive-phase input terminal of the analog signal processing section 514 of differential input type. Also, the analog addition section 513N converts the time-series digital signals DN(k) (k=0 to M−1) of negative-phase and dither signal (DITHER) into an analog signal respectively and adds them, and outputs the analog signal of negative-phase which is the D/A conversion result to a negative-phase input terminal of the analog signal processing section 514 of differential input type. The configuration of analog addition sections 513P and 513N is equal to the analog addition section 503 of the first embodiment.

In the analog addition section 513P, an addition result of the respective analog signals corresponding to the time-series digital signals DP(k) (k=0 to M−1) of positive-phase includes a component of the dither signal (DITHER). However, since the addition result of the respective analog signals corresponding to the time-series digital signals DP(k) (k=0 to M−1) of positive-phase and the analog signal corresponding to the reversal dither signal (DITHER_N) are added at the analog addition section 513P, the component of the dither signal (DITHER) included in the former and the component of the reversal dither signal (DITHER_N) included in the latter are cancelled each other, thereby preventing the component of the dither signal (DITHER) from appearing in the analog signal of positive-phase which is the D/A conversion result. Also, in the analog addition section 513N, the component of waveform inverted from the dither signal (DITHER) is included in an addition result of the respective analog signals corresponding to the time-series digital signals DN(k) (k=0 to M−1) of negative-phase. However, since the addition result of the respective analog signals corresponding to the time-series digital signals DN(k) (k=0 to M−1) of negative-phase and the analog signal corresponding to the dither signal (DITHER) are added at the analog addition section 513N, the component inverted from waveform of the dither signal (DITHER) included in the former and the component of the dither signal included in the latter are cancelled each other, thereby preventing component of the dither signal (DITHER) from appearing in the analog signal of negative-phase which is the D/A conversion result. Therefore, according to the present embodiment, the same effect as the first embodiment is obtained.

The Third Embodiment

FIG. 7 is a circuit diagram showing the configuration of a digital input class-D amplifier including D/A converter circuit which is the third embodiment of the present invention. In the present embodiment and the fourth to eighth embodiments described later, the D/A converter circuit according the second embodiment is applied to the digital input class-D amplifier. Also, although the digital input class-D amplifier according to the third to fourth embodiments includes circuits corresponding to the ΔΣ modulation section 501 and the dither signal generation section 505 of the second embodiment, they are not shown in the drawing.

In FIG. 7, voltage-current conversion sections 21($k$) (k=0 to M−1) and a voltage-current conversion section 701 correspond to the analog addition section 513P of the second embodiment. The time-series digital signals DP(k) (k=0 to M−1) of positive-phase outputted from the DEM decoder 10 are supplied respectively to the voltage-current conversion sections 21($k$) (k=0 to M−1) comprising a non-inverting buffer 21*a* and a resistor 21*b*. The reversal dither signal (DITHER_N) outputted from a dither signal generation section (not shown) is supplied to the voltage-current conversion section 701 comprising a non-inverting buffer 701*a* and a resistor 701*b*. Also, voltage current conversion sections 22($k$) (k=0 to M−1) and a voltage current conversion section 702 correspond to the analog addition section 513N of the second embodiment. The time-series digital signals DN(k)(k=0 to M−1) of negative-phase outputted from the DEM decoder 10 are supplied respectively to the voltage current conversion sections 22($k$) (k=0 to M−1) comprising a non-inverting buffer 22*a* and a resistor 22*b*. The dither signal (DITHER) outputted from a dither signal generation section (not shown) is supplied to the voltage-current conversion section 702 comprising a non-inverting buffer 702*a* and a resistor 702*b*. Under an ideal circumstance, the resistance value of the respective resistors 21*b* of the voltage-current conversion sections 21($k$) (k=0 to M−1) and the resistance value of the respective resistors 22*b* of the voltage-current conversion sections 22(k) (k=0 to M−1) are the same. Also, the resistance value of the resistor 701b of the voltage-current conversion section 701 and the resistance value of the resistor 702b of the voltage-current conversion section 702 are decided based on the amplitude of the dither signal (DITHER), as described in the first embodiment.

A section comprising an error integrator 30, a PWM modulation circuit 40, pre-drivers 51 and 52 and an output buffer 60 corresponds to the analog signal processing section 514 of differential input type in the second embodiment. The error integrator 30 comprises a differential amplifier 31 and capacitors 32 and 33 for integration purpose. In this case, the capacitor 32 is interposed between a negative-phase output terminal (a minus output terminal) and a positive-phase input terminal (a plus input terminal) of the differential amplifier 31, and the capacitor 33 is interposed between a positive-phase output terminal (a plus output terminal) and a negative-phase input terminal (a minus input terminal) of the differential amplifier 31.

The respective current output terminals of the voltage-current conversion sections 21(k) (k=0 to M−1) as described above (ends among both ends of the resistor 21b, which are not connected to the non-inverting buffer 21a) and a current output terminal of the voltage-current conversion section 701 (ends among both ends of the resistor 701b, which are not connected to the non-inverting buffer 701a) are connected commonly to the positive-phase input terminal (the plus input terminal) of the differential amplifier 31 of error integrator 30. Moreover, the respective current output terminals of the voltage-current conversion sections 22(k) (k=0 to M−1) as described above (ends among both ends of the resistor 22b, which are not connected to the non-inverting buffer 22a) and a current output terminal of the voltage-current conversion section 702 (ends among both ends of the resistor 702b, which are not connected to the non-inverting buffer 702a) are connected commonly to the negative-phase input terminal (the minus input terminal) of the differential amplifier 31 of error integrator 30. Further, an electric current conforming to an output voltage VOn of an output buffer 60 described later is negatively fed back to the positive-phase input terminal of the differential amplifier 31 by way of a resistor 71, an electric current conforming to an output voltage VOp of the output buffer 60 described later is negatively fed back to the negative-phase input terminal by way of a resistor 72.

A total sum of electric currents supplied to the positive-phase input terminal of the differential amplifier and a total sum of electric currents supplied to the negative-phase input terminal of the differential amplifier 31 serve as input analog signals of two phases, the positive and the negative phases, to the error integrator 30. In this case, although an electric current corresponding to the time-series digital signals DP(k) (k=0 to M−1) of positive-phase and an electric current corresponding to the reversal dither signal (DITHER_N) are supplied to the positive-phase input terminal of the differential amplifier 31, a component of the dither signal (DITHER) included in the electric current of the former and a component of the reversal dither signal (DITHER_N) included in the electric current of the latter are cancelled each other. Therefore, the component of the dither signal is not supplied to the positive-phase input terminal of the differential amplifier 31. Also, although an electric current corresponding to the negative phase time-series digital signals DN(k) (k=0 to M−1) and an electric current corresponding to the dither signal (DITHER) are supplied to the negative-phase input terminal of the differential amplifier 31, a component inverted from the waveform of the dither signal (DITHER) included in the electric current of the former and a component corresponding to the dither signal (DITHER) included in the electric current of the latter are cancelled each other. Therefore, the component of the dither signal is not also supplied to the negative-phase input terminal of the differential amplifier 31.

When the power source voltage of the digital input class-D amplifier according to the present embodiment is VDD, the differential amplifier 31 performs, while receiving negative feedback as described above, differential amplification of input analog signals of two phases, the positive and the negative phases, with the potential of the positive-phase input terminal and the potential of the negative-phase input terminal being virtually grounded to; for example, a level of VDD/2. According to this, carriers obtained by integration of input analog signal of the respective phases are accumulated in the capacitors 32 and 33, and the integration result signals VEp and VEn of two phases, the positive and the negative phases, representing a result of the integration are outputted from the error integrator 30.

The PWM modulation circuit 40 is a circuit which compares the integration result signals VEp and VEn outputted from the error integrator 30 with a triangular wave of a predetermined frequency, which generates pulses VDp and VDn pulse-width modulated according to a voltage difference VEp-VEn between the integration result signals VEp and VEn, and which supplies them to the pre-drivers 51 and 52. In more detail, when the voltage difference VEp-VEn is plus, the PWM modulation circuit 40 supplies the pre-driver 51 with a pulse VDp having a pulse width which is longer than one-half of the period of the triangular wave by a time length conforming to the voltage difference VEp-VEn, as well as supplying the pre-driver 52 with a pulse VDn phase-inverted from the pulse VDp. When the voltage difference VEp-VEn is minus, the PWM modulation circuit 40 supplies the pre-driver 51 with a pulse VDp having a pulse width which is shorter than one-half of the period of the triangular wave by a time length conforming to the voltage difference VEp-VEn, as well as supplying the pre-driver 52 with a pulse VDn phase-inverted from the pulse VDp.

An output buffer 60 comprises a P-channel MOS output transistor 61P and an N-channel MOS output transistor 61N interposed in series between the power source VDD and a ground, and a P-channel MOS output transistor 62P and an N-channel MOS output transistor 62N interposed in series between the power source VDD and a ground. In this case, a load 100 having a speaker, a low-pass filter and the like, is inserted between a node of drains of the output transistors 61P and 61N and a node of drains of the output transistors 62P and 62N.

The pre-drivers 51 and 52 supply pulses to gates of the respective transistors 61P, 61N, 62P and 62N so that an electric current is applied to the load 100 by way of the output transistors 61P and 62N during a period conforming to the pulse width of pulse VDp and that an electric current is applied to the load 100 by way of the output transistors 62P and 61N during a period conforming to the pulse width of pulse VDn. Also, in order to prevent occurrence of a so-called through current, the pre-drivers 51 and 52 include a circuit which controls a timing of pulses to be supplied to the gates of the respective transistors so that two P-channel transistors and N-cannel transistors connected in series without involvement of the load 100 (i.e., a set consisting of the output transistors 61P and 61N and a set consisting of the output transistors 62P and 62N) is not turned ON simultaneously.

The output voltage VOp developing in a node between the drains of the output transistors 61P and 61N in the output buffer 60 is negatively fed back to the negative-phase input terminal of the differential amplifier 31 of the above-mentioned error integrator 30 by way of the resistor 72. Moreover, the output voltage VOn developing in a node between the drains of the output transistors 62P and 62N in the output buffer 60 is negatively fed back to the positive-phase input terminal of the differential amplifier 31 of the above-mentioned error integrator 30 by way of the resistor 71.

The above are details of the digital input class-D amplifier of the present embodiment.

According to the present embodiment, the DEM decoder 10 generates the time-series digital signals DP(k) (k=0 to M−1) which have a density of "1" conforming to the sample value of the input digital signal Din to the DEM decoder 10, as well as the time-series digital signals DN(k) (k=0 to M−1) which have a density of "0" conforming to the same sample value. And, the electric currents conforming to the time-series digital signals DP(k) (k=0 to M−1) are supplied to the error integrator 30 by way of the voltage-current conversion sections 21($k$) (k=0 to M−1), and the electric currents conforming to the time-series digital signals DN(k) (k=0 to M−1) are supplied to the error integrator 30 by way of the voltage-current conversion sections 22($k$) (k=0 to M−1). Also, at that time, the electric currents conforming to the reversal dither signal (DITHER_N) are added with the electric currents conforming to the time-series digital signals DP(k) (k=0 to M−1), and the electric currents conforming to the dither signal (DITHER) are added with the electrics current conforming to the time-series digital signals DN(k) (k=0 to M−1), which prevents from inputting the component of the dither signal to the error integrator 30.

While receiving a negative feedback of signal conforming to the drive waveform to be supplied to the load 100, the error integrator 30 integrates the input analog signals of two phases, the positive and the negative phases, which are the sum of the respective electric currents conforming to the respective time-series digital signals DP(k) (k=0 to M−1) and the sum of the respective electric currents conforming to the time-series digital signals DN(k) (k=0 to M−1). The PWM modulation circuit 40 generates the pulses VDp and VDn with a pulse width conforming to the result of integration, and the pre-drivers 51 and 52 and the output buffer 60 drive the load 100 in accordance with the pulses VDp and VDn.

In this way, integration of a difference between the sum of the electric currents corresponding to the time-series digital signals DP(k) (k=0 to M−1) and the sum of the electric currents corresponding to the time-series digital signals DN(k) (k=0 to M−1), generation of the pulses VDp and VDn with a pulse width conforming to the result of integration, and driving of the load 100 in accordance with the pulses are performed, while the negative feedback from the load 100 is controlled. As a result, a drive waveform of the load 100 is a waveform formed by averaging along the time axis a difference between the sum of the time-series digital signals DP(k) (k=0 to M−1) and the sum of the time-series digital signals DN(k) (k=o to M−1) and does not include the component of the dither signal (DITHER).

However, under the ideal circumstance where no variations exist in the resistance values of the respective resistors 21b of the voltage-current conversion sections 21($k$) (k=0 to M−1), the respective voltage-current conversion sections 21($k$) output an electric current ΔI (=VDD/(2R)) during a period in which the time-series digital signals DP(k) supplied to the respective are "1", and output an electric current −ΔI (=−VDD/(2R)) during a period in which the time-series digital signals DP(k) supplied to the respective are "0". Likewise, under the ideal circumstance where no variations exist in the resistance values of the respective resistors 22b of the voltage-current conversion sections 22($k$) (k=0 to M−1), the respective voltage-current conversion sections 22($k$) output an electric current ΔI during a period in which the time-series digital signals DN(k) supplied to the respective are "1", and output an electric current −ΔI during a period in which the time-series digital signals DN(k) supplied to the respective are "0".

However, in reality, variations arise in the resistance values of the respective resistors 21b and the resistance values of the respective resistors 22b, the respective output electric currents of the voltage-current conversion sections 21($k$) (k=0 to M−1) and the respective output electric currents of the voltage-current conversion sections 22($k$) (k=0 to M−1) have variations around the electric current ΔI or −ΔI.

However, in the course of integration processing of the analog signal, deviations of the respective output electric currents of the voltage-current conversion sections 21($k$) (k=0 to M−1) and deviations of the respective output electric currents of the voltage-current conversion sections 22($k$) (k=0 to M−1) from a value of an ideal electric current are cancelled each other, and hence the analog signal substantially inputted to the error integrator 30 during each of sampling periods accurately corresponds to a sample value indicated by the input digital signal Din during that sampling period.

While operating the negative feedback conforming to the output voltages VOp and VOn from the output buffer 60 to be supplied to the load 100, the error integrator 30 integrates an analog signal corresponding to a difference between the sum of the respective output electric currents of the voltage-current conversion sections 21($k$) (k=0 to M−1) and the sum of the respective output electric currents of the voltage-current conversion sections 22($k$) (k=0 to M−1), and the pulses VDp and VDn with a pulse width conforming to the result of integration are generated by means of the PWM modulation circuit 40. Consequently, according to the present embodiment, a drive of the load 100 is performed by means of the waveform accurately reflecting the input digital signal Din.

Also, according to the present embodiment, there is provided no particular averaging circuit which averages the sum of the respective output electric currents of the voltage-current conversing sections 21($k$) (k=0 to M−1) and the sum of the respective output electric currents of the voltage-current conversing sections 22($k$) (k=0 to M−1) along the time axis, and the error integration 30 is caused to perform the processing to be performed by the averaging circuit. Therefore, the circuit scale is reduced and a chip area can be reduced when the digital input class-D amplifier is implemented as a semiconductor integrated circuit. Also, since there is no averaging circuit, an output noise of the digital input class-D amplifier is reduced, and an offset voltage is reduced, and a consumption power can be reduced.

Also, according to the present embodiment, the component of the dither signal (DITHER) included in the input digital signal Din to the DEM decoder 10 are removed before inputting to the error integrator 30. Hence, the component of the dither signal (DITHER) can be prevented from appearing in the drive waveform of the load 100.

Also, according to the present embodiment, further advantages are achieved as follows. First, the PWM modulation circuit 40 performs, so to speak, a resampling of the output signal of the error integrator 30. In the case the frequency of the dither signal (DITHER) is close to the frequency which performs the resampling (a frequency of triangular wave used in PWM modulation), if the component of the dither signal (DITHER) passes though the error integrator 30 and is transmitted to the PWM modulation circuit 40 to be resampled, there is a problem that an aliasing noise arises in the output signals VDp and VDn of the PWM modulation circuit 40.

However, according to the present embodiment, since transmitting of the component of the dither signal (DITHER) to the error integrator 30 is prevented, occurrence of this problem is prevented.

The Fourth Embodiment

In the third embodiment, there are provided the voltage-current conversion sections 21(*k*) (k=0 to M−1), 22(*k*) (k=0 to M−1), 701 and 702 which output to the input terminal of the error integrator 30 electric currents conforming to each of a plurality of lines of time-series digital signals outputted from the DEM decoder 10 respectively, and current-addition-type D/A converters are configured between the DEM decoder 10 and the error integrator 30. However, voltage-addition-type D/A converters may be configured between the DEM decoder 10 and the error integrator 30 in place of the current-addition-type D/A converters.

In the example shown in FIG. 8, a voltage addition circuit 110 which adds each voltage conforming to the time-series digital signals DP(k) (k=0 to M−1) outputted from the DEM decoder 10 and a voltage conforming to the reversal dither signal (DITHER_N) and supplies the result of addition to the positive-phase input terminal of the error integrator 30, and a voltage addition circuit 120 which adds each voltage conforming to the time-series digital signals DN(k) (k=0 to M−1) and a voltage conforming to the dither signal (DITHER) and supplies the result of addition to the negative-phase input terminal of the error integrator 30 are interposed between the DEM decoder 10 and the error integrator 30. Also, in FIG. 8, a circuit configuration behind the PWM modulation circuit 40 in FIG. 7 is not shown.

The voltage addition circuit 110 has M switches 111(*k*) (k=0 to m−1) whose single ends are connected to a power source VDD and which are turned on when the respective time-series digital signals DP(k) are "1"; a switch 703 whose single end is connected to the power source VDD and which is turned on when the reversal dither signal (DITHER_N) is "1"; M resistors 112(*k*) (k=0 to M−1) whose single ends are connected to respective other ends of the switches 111(*k*) (k=0 to M−1); a resistor 704 whose single end is connected to the other end of the switch 703; a resistor 113 inserted between the common node of respective other ends of the resistors 112(*k*) (k=0 to M−1) and the other end of the resistor 704 and a ground line; a voltage follower circuit 114 which receives a voltage developing in the common node between the resistors 112(*k*) (k=0 to m−1) and 704 and the resistor 113 and which outputs a voltage having the same voltage value as that; and a resistor 115 inserted between an output terminal of the voltage follower circuit 114 and the positive-phase input terminal of the differential amplifier 31.

Also, voltage addition circuit 120 has the same configuration as that of the voltage addition circuit 110. The voltage addition circuit 120 has M switches 121(*k*) (k=0 to m−1) whose single ends are connected to the power source VDD and which are turned on when the respective time-series digital signals DP(k) are "1"; a switch 705 whose single end is connected to the power source VDD and which is turned on when the dither signal (DITHER) is "1"; M resistors 122(*k*) (k=0 to M−1) whose single ends are connected to respective other ends of the switches 121(*k*) (k=0 to M−1); a resistor 706 whose single end is connected to the other end of the switch 705; a resistor 123 inserted between the common node of respective other ends of the resistors 122(*k*) (k=0 to M−1) and the other end of the resistor 706 and a ground line; a voltage follower circuit 124 which receives a voltage developing in the common node between the resistors 122(*k*) (k=0 to m−1) and 706 and the resistor 123 and which outputs a voltage having the same voltage value as that; and a resistor 125 inserted between an output terminal of the voltage follower circuit 124 and the negative-phase input terminal of the differential amplifier 31.

In this case, the resistors 112(*k*) (k=0 to M−1) and the resistors 122(*k*) (k=0 to M−1) assume the same resistance value, and the resistors 113 and 123 assume the same resistance value. And, the resistors 704 and 706, as described in the first embodiment, have a resistance value conforming to amplitude of the dither signal (DITHER). Also, the resistors 112(*k*) (k=0 to M−1), the resistors 122(*k*) (k=0 to M−1) and the resistors 704 and 706 are sufficiently greater than the resistors 113 and 123 in terms of a resistance value, and work as a constant-current source.

Accordingly, in each point of time, an electric current proportional to the number of a value "1" among the bits of the M-bit time-series digital signals DP(k) (k=0 to M−1) and an electric current conforming to the reversal dither signal (DITHER_N) flow into the resistor 113, and a voltage which has removed the component of the dither signal (DITHER) from a signal value shown by the M-bit time-series digital signals DP(k) (k=0 to M−1) develops across the resistor 113, and the voltage is outputted from the voltage follower circuit 114. Also, in each point of time, an electric current proportional to the number of a value "1" among the bits of the M-bit time-series digital signals DN(k) (k=0 to M−1), and an electric current conforming to the dither signal (DITHER) flows into the resistor 123, and a voltage which has removed the component of signal inverted from the dither signal (DITHER) from a signal value shown by the M-bit time-series digital signals DN(k) (k=0 to M−1) develops across the resistor 123, and the voltage is outputted from the voltage follower circuit 124.

Also, when M/2 bits among the time-series digital signals DP(k) are "1", and when M/2 bits among the time-series digital signals DN(k) are "0" (i.e., the other M/2 bits are "1"), the voltage follower circuits 114 and 124 output a voltage having the same voltage value (for example, referred to as Vref). In the present example, the voltage Vref assumes the same level as the virtual ground level of the positive-phase input terminal and the negative-phase input terminal of the differential amplifier 31.

Accordingly, in the present example, when the number of a value "1" among each bit of the time-series digital signals DP(k) is M/2+ΔM bits, a voltage proportional to ΔM develops across the resistor 115, and an electric current proportional to the voltage value flows into the positive-phase input terminal of the differential amplifier 31. In this case, since the number of a value "0" among each bit of the time-series digital signals DN(k) is M/2+ΔM, and the number of a value "1" is M/2−ΔM, a voltage proportional to −ΔM develops across the resistor 125, and an electric current proportional to the voltage value flows into the negative-phase input terminal of the differential amplifier 31 (the orientation of the electric current becomes opposite to that of the electric current flowing to the positive-phase input terminal).

Even in the present embodiment, an advantage similar to that of the third embodiment is achieved.

The Fifth Embodiment

In the example shown in FIG. 9, the voltage addition circuits 110 and 120 in FIG. 8 are replaced with voltage addition circuits 110A and 120A. In this case, the voltage addition circuit 110A corresponds to the voltage addition circuit 110 whose resistors 112(*k*) (k=o to M−1) and resistor 704 are replaced with constant current sources 116(k) (k=o to M−1) and constant current source 707, and the voltage addition circuit 120A corresponds to the voltage addition circuit 120 whose resistors 122(k) (k=o to M−1) and resistor 706 are replaced with constant current sources 126(k) (k=o to M−1) and constant current source 708. Even in the present example, an advantage similar to that of the fourth embodiment is achieved.

The Sixth Embodiment

In an example shown in FIG. 10, the voltage addition D/A converters configured between the DEM decoder 10 and the error integrator 30 are more simplified. In the present example, the output terminals of the voltage-current conversion sections 21(k) (k=0 to M−1) and the voltage-current conversion section 701 in the third embodiment (FIG. 7) are connected commonly to one end of a resistor 131, and the other end of the resistor 131 is connected to the positive-phase input terminal of the differential amplifier 31. The output terminals of the voltage-current conversion sections 22(k) (k=0 to M−1) and the voltage-current conversion section 702 in the third embodiment (FIG. 7) are connected commonly to one end of a resistor 141, and the other end of the resistor 141 is connected to the negative-phase input terminal of the differential amplifier 31. Also, in the example, when the power source voltage is taken as VDD, the virtual ground level of the positive-phase input terminal and the negative-phase input terminal of the differential amplifier 31 are taken as VDD/2.

Even in the example, when the number of a value "1" among each bit of the time-series digital signals DP(k)(k=0 to M−1) is M/2+ΔM, a voltage proportional to ΔM develops across the resistor 131, and an electric current proportional to the voltage flows into the positive-phase input terminal of the differential amplifier 31. Also, when the number of a value "0" among each bit of the time-series digital signals DN(k) (k=0 to M−1) is M/2+ΔM, a voltage proportional to −ΔM develops across the resistor 141, and an electric current proportional to the voltage flows into the negative-phase input terminal of the differential amplifier 31. Therefore, an advantage similar to that of the third to fifth embodiments is achieved.

The Seventh Embodiment

In the example shown in FIG. 11, the resistors 131 and 141 in FIG. 10 are replaced with switched capacitor circuits 150 and 160 respectively. The switched capacitor circuit 150 has switches 151 to 154 and a capacitor 155. The switch 151, the capacitor 155 and the switch 154 are sequentially inserted between an input terminal (a terminal of the voltage-current conversion sections 21(k) (k=0 to M−1) side) and an output terminal (a terminal of the differential amplifier 31 side) of the switched capacitor circuit 150. A switch 152 is inserted between a power source for generating a reference level Verf and a node between the switch 151 and one electrode of the capacitor 155, and a switch 153 is inserted between a power source for generating a reference level Verf and a node between the switch 154 and other electrode of the capacitor 155. A switched capacitor circuit 160 is also the same configuration as the switched capacitor circuit 150, and is configured by switches 161 to 164 and a capacitor 165.

As the example shown in FIG. 10, when the source voltage is taken as VDD, a virtual ground level of the positive-phase input terminal and the negative-phase input terminal of the differential amplifier 31 is taken as VDD/2. And, the reference level Verf is set to the same level as the virtual ground level.

Clocks of two phases Φa and Φb are given to the switched capacitor circuits 150 and 160. These clocks φa and Φb, as shown in FIG. 12, are arising one by one each bit period Tb of time-series digital signals DP(k) (k=0 to M−1) and DN(k) (k=0 to M−1).

By means of the clock Φa first arising in each bit period Tb, the switches 151 and 153 in the switched capacitor circuit 150 and switches 161 and 163 in the switched capacitor circuit 160 are turned ON. According to this, electric charges confirming to the respective input voltages to the switched capacitor circuits 150 and 160 are accumulated in capacitors 155 and 165, respectively. And, by means of the clock signal Φb arising later, the switches 152 and 154 in the switched capacitor circuit 150 and the switches 162 and 164 in the switched capacitor circuit 160 are turned ON. According to this, the electric charges accumulated in the capacitor 155 of the switched capacitor circuit 150 flow into the positive-phase input terminal of the differential amplifier 31, and the electric charges accumulated in the capacitor 165 of the switched capacitor circuit 160 flow into the negative-phase input terminal of the differential amplifier 31.

By means of repetition of these operations, the switched capacitor circuits 150 and 160 function as resistors which supply the positive-phase input terminal and the negative-phase input terminal of the differential amplifier 31 with an electric current proportional to a voltage between the respective input terminals and output terminals. Therefore, even in the present example, the same advantage as the sixth embodiment is achieved.

The Eighth Embodiment

FIG. 13 shows an example of configuration where a capacitance-addition-type D/A converter is provided between the DEM decoder 10 and the error integration 30 instead of a voltage-current conversion section as in FIG. 7. In the present example, switched capacitor circuits 170(k) (k=0 to M−1) and switched capacitor circuits 180(k) (k=0 to M−1) are inserted between the DEM decoder 10 and the error integration 30. The time-series digital signals DP(k) (k=0 to M−1) are respectively supplied from the DEM decoder 10 to the switched capacitor circuits 170(k) (k=0 to M−1), and the time-series digital signals DN(k) (k=0 to M−1) are respectively supplied from the DEM decoder 10 to the switched capacitor circuits 180(k) (k=0 to M−1). The respective output terminals of the switched capacitor circuits 170(k) (k=0 to M−1) are connected commonly to the positive-phase input terminal of the differential amplifier 31. Further, the respective output terminals of the switched capacitor circuits 180(k) (k=0 to M−1) are connected commonly to the negative-phase input terminal of the differential amplifier 31.

The switched capacitor circuits 170(k) (k=0 to M−1) have a non-inverting buffer 171, switches 172 through 175, and a capacitor 176. The switched capacitor circuits 180(k) (k=0 to M−1) have a non-inverting buffer 181, switches 182 through 185, and a capacitor 186. The switched capacitor circuits 170(k) (k=0 to M−1) and 180(k) (k=0 to M−1) are the same configuration as the switched capacitor circuits 150 and 160 in FIG. 11 except that the non-inverting buffers 171 and 181 are provided at the respective input sections.

Also, in the present example, switched capacitor circuits 711 and 712 which is the same configuration as the switched capacitor circuits 170(k) (k=0 to M−1) and 180(k) (k=0 to M−1) are provided. In this case, the reversal dither signal (DITHER_N) is supplied to an input terminal of the switched capacitor circuit 711, and an output terminal of that is connected to the positive-phase input terminal of the differential amplifier 31. Further, the dither signal (DITHER) is supplied to an input terminal of the switched capacitor circuit 712, and an output terminal of that is connected to the negative-phase input terminal of the differential amplifier 31.

As the example shown in FIG. 11, in the present example, when the power source voltage is taken as VDD, the virtual ground levels of the positive-phase input terminal and the negative-phase input terminal of the differential amplifier 31 are taken as VDD/2. In each bit period, when the number of a value "1" among each bit of the time-series digital signals DP(k) (k=0 to M−1) is M/2+ΔM, the switched capacitor circuits 170(k) (k=0 to M−1) supply the positive-phase input terminal of the differential amplifier 31 with an electric charge proportional to ΔM. Also, in the present case, the number of a value "1" among each bit of the time-series digital signals DN(k) (k=0 to M−1) becomes M/2−ΔM, and the switched capacitor circuits 180(k) (k=0 to M−1) supply the negative-phase input terminal of the differential amplifier 31 with an electric charge proportional to −ΔM.

Also, in the present embodiment, the switched capacitor circuit 711 supplies the positive-phase input terminal of the differential amplifier 31 with an electric charge conforming to the reversal dither signal (DITHER_N), and offsets it with a component corresponding to the dither signal (DITHER) included in electric current waveform which is supplied by means of the switched capacitor circuits 170(k) (k=0 to M−1). Also, in the present embodiment, the switched capacitor circuit 712 supplies the negative-phase input terminal of the differential amplifier 31 with an electric charge conforming to the dither signal (DITHER), and cancels it with a component of waveform inverted from the dither signal (DITHER) included in electric current waveform which is supplied by means of the switched capacitor circuits 180(k) (k=0 to M−1).

Therefore, even in the present example, the same advantage as the seventh embodiment is achieved.

Other Embodiments

Although each embodiment of the present invention has been described thus far, in the present invention, various kinds of embodiments are conceivable besides it. For example, as follows:

(1) In the third to eighth embodiments, although the present invention is applied to the digital input class-D amplifier which performs pulse width modulation in accordance with the output voltage VEp and VEn of the error integrator, it is allowable that the present invention is applied to the digital input class-D amplifier which performs pulse density modulation in accordance with the output voltage VEp and VEn of the error integrator.

(2) The range to which the digital input class-D amplifier according to the present invention can be applied is not limited to a power amplifier for audio equipment. For instance, it may also be used for an amplifier for driving a heat-generating element in a thermal printer, an amplifier for generating a drive signal of a display device, and the like.

(3) Although square wave is used as the dither signal (DITHER) and the reversal dither signal (DITHER_N) in the respective embodiment, it is allowable to use other alternating current signal such as triangular wave and the like.

What is claimed is:

1. A Digital-to-Analog converter circuit comprising:
a dither signal generator which outputs a dither signal which is an alternating current signal and a reversal dither signal inverted from the dither signal;
a decoder which processes an input digital signal including a component of the dither signal and outputs a plurality of lines of time-series digital signals having a density of "1" or "0" conforming to the input digital signal;
an analog adder which converts the plurality of lines of time-series digital signals and the reversal dither signal into an analog signal respectively and adds the respective analog signals to be a combined signal, and outputs the combined signal as an analog signal which is a Digital-to-Analog conversion result.

2. The Digital-to-Analog converter circuit according to claim 1, wherein the analog adder has a plurality of voltage-current conversion sections which output currents conforming to each of a plurality of input signals respectively, and adds the currents outputted from the plurality of voltage-current conversion sections to be a combined current and outputs the combined current.

3. The Digital-to-Analog converter circuit according to claim 1, wherein the analog adder adds voltages conforming to each of a plurality of input signals to be a combined voltage, and outputs currents conforming to the combined voltage.

4. The Digital-to-Analog converter circuit according to claim 1, wherein the analog adder has a plurality of switched capacitor circuits which generate electric charges conforming to each of a plurality of input signals, and outputs a sum of currents outputted through the plurality of switched capacitor circuits.

5. The Digital-to-Analog converter circuit according to claim 1, wherein the decoder is a dynamic element matching decoder.

6. A digital input class-D amplifier, comprising:
a Digital-to-Analog converter circuit disclosed in claim 1;
an error integrator which integrates a difference between an output signal of the Digital-to-Analog converter circuit and a drive waveform to be supplied to a load; and
a modulation circuit which generates a pulse modulated with a pulse width or a pulse density in accordance with a result of integration of the error integrator,
wherein the load is driven on the basis of the pulse generated by the modulation circuit.

7. A Digital-to-Analog converter circuit comprising:
a dither signal generator which outputs a dither signal which is an alternating current signal and a reversal dither signal inverted from the dither signal;
a decoder which processes an input digital signal including a component of the dither signal and outputs a plurality of lines of time-series digital signals of positive-phase and a plurality of lines of time-series digital signals of negative-phase in equilibrium with the time-series digital signals of positive-phase, each lines of the time-series digital signals of positive-phase and negative-phase having a density of "1" or "0" conforming to the input digital signal;
an analog adder which converts the plurality of lines of time-series digital signals of positive-phase and the reversal dither signal into an analog signal respectively and adds the respective analog signals to be a first combined signal, and outputs the first combined signal to a differential-input-type analog signal processing section as a positive-phase analog signal which is a Digital-to-Analog conversion result, and converts the plurality of lines of time-series digital signals of negative-phase and the dither signal into an analog signal respectively and adds the respective analog signals to be a second combined signal, and outputs the second combined signal to the differential-input-type analog signal processing section as a negative-phase analog signal which is a Digital-to-Analog conversion result.

8. The Digital-to-Analog converter circuit according to claim 7, wherein the analog adder has a plurality of voltage-current conversion sections which output currents conforming to each of a plurality of input signals respectively, and adds the currents outputted from the plurality of voltage-current conversion sections to be a combined current and outputs the combined current.

9. The Digital-to-Analog converter circuit according to claim 7, wherein the analog adder adds voltages conforming to each of a plurality of input signals to be a combined voltage, and outputs currents conforming to the combined voltage.

10. The Digital-to-Analog converter circuit according to claim 7, wherein the analog adder has a plurality of switched capacitor circuits which generate electric charges conforming to each of a plurality of input signals, and outputs a sum of currents outputted through the plurality of switched capacitor circuits.

11. The Digital-to-Analog converter circuit according to claim 7, wherein the decoder is a dynamic element matching decoder.

12. A digital input class-D amplifier, comprising:
a Digital-to-Analog converter circuit disclosed in claim 7;
an error integrator which integrates a difference between an output signal of the Digital-to-Analog converter circuit and a drive waveform to be supplied to a load; and
a modulation circuit which generates a pulse modulated with a pulse width or a pulse density in accordance with a result of integration of the error integrator,
wherein the load is driven on the basis of the pulse generated by the modulation circuit.

* * * * *